United States Patent [19]

Flournoy

[11] 3,971,959

[45] July 27, 1976

[54] TIMING MODE SELECTOR

[75] Inventor: Norman Eustace Flournoy, Richmond, Va.

[73] Assignee: Texaco Inc., New York, N.Y.

[22] Filed: Nov. 24, 1972

[21] Appl. No.: 309,392

[52] U.S. Cl. .................. 307/225 R; 307/233 R; 328/46
[51] Int. Cl.² ............... H03K 21/32; H03K 21/36
[58] Field of Search ............... 307/233, 225, 225 R, 307/233 R; 328/46

[56] References Cited
UNITED STATES PATENTS

| | | | |
|---|---|---|---|
| 3,271,588 | 9/1966 | Minc | 307/88.5 |
| 3,407,357 | 10/1968 | Spandorfer et al. | 328/92 |
| 3,469,109 | 9/1969 | Schrecongost | 307/220 |
| 3,538,344 | 11/1970 | Schlisser | 307/219 |
| 3,585,509 | 6/1971 | Davis et al. | 328/145 |
| 3,610,954 | 10/1971 | Treadway | 307/232 |
| 3,639,844 | 1/1972 | Karklys | 328/130 |
| 3,657,658 | 4/1972 | Kubo | 328/61 |
| 3,688,202 | 8/1972 | Naubereit et al. | 328/133 |
| 3,694,667 | 9/1972 | Staker | 307/232 |
| 3,701,027 | 10/1972 | Belton | 328/17 |

*Primary Examiner*—Andrew J. James
*Assistant Examiner*—Joseph E. Clawson, Jr.
*Attorney, Agent, or Firm*—T. H. Whaley; C. G. Ries; Henry C. Dearborn

[57] ABSTRACT

An electrical system for selecting one of two modes, or signal pulse rates. It employs electronic elements to divide a source of clock pulses into two different pulse rates. The system also employs integrated circuits for counting the clock pulses. and a plurality of NAND gates connected so as to pass the selected one of the counting rates, or modes. The NAND gates are controlled by an on-off signal input.

1 Claim, 1 Drawing Figure

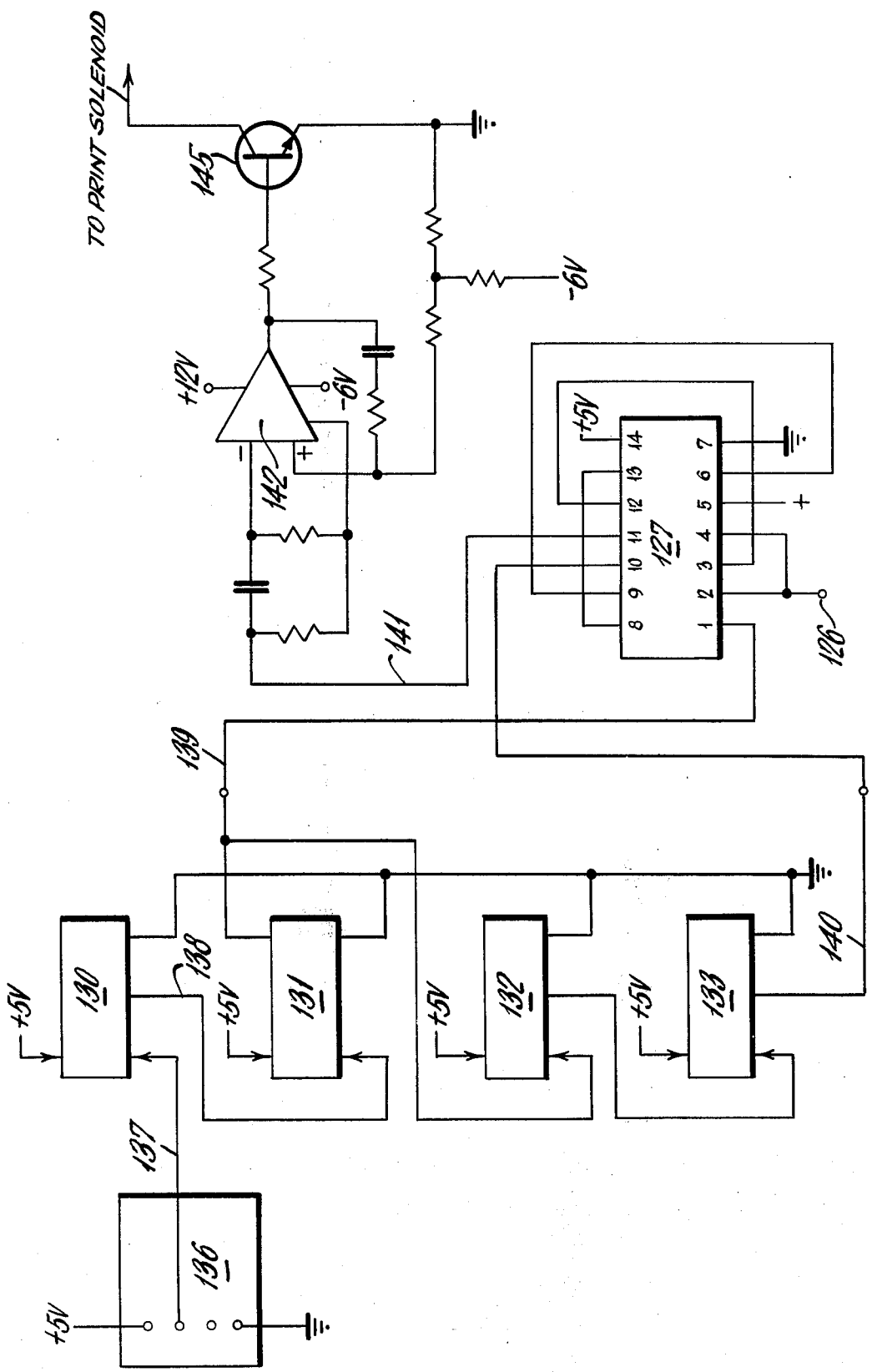

TIMING MODE SELECTOR

CROSS-REFERENCE TO RELATED APPLICATION

This application concerns part of the disclosure from co-pending application of Messrs. N. E. Flournoy and R. H. Clinard, Jr., Ser. No. 183,500, filed Sept. 24, 1971, now U.S. Pat. No. 3,744,298.

BACKGROUND OF THE INVENTION

1. Field of the Invention

This invention deals with timing signals in general, and more specifically concerns a timing mode selector.

2. Description of the Prior Art

While, of course, timing signals have been generated in various ways for various uses in the past, the provision of two related timing-pulse sources with a simple on-off control to switch from one mode to the other has not been heretofore known.

Consequently, it is an object of this invention to provide a timing mode selector that can switch from one mode of timing-signal source to another, merely by supplying an on-off signal to the system.

SUMMARY OF THE INVENTION

Briefly, the invention concerns a timing mode selector that comprises in combination a source of clock pulses and means for dividing said pulses into two different frequencies thereof. It also comprises a mode-control signal having an on-state for one mode and an off-state for another mode. Lastly, it also comprises circuit means for transmitting one of said frequencies only to an output circuit. Which one is transmitted depends upon said mode-control signal.

Again, briefly, the invention concerns a timing mode selector that comprises in combination a clock-pulse generator, and a first pair of integrated-circuit counters connected in series to the output of said generator to provide a predetermined first mode pulse rate output. It also comprises a second pair of integrated-circuit counters connected in series to said first mode pulse rate output to provide a predetermined second mode pulse rate output, and a unitary integrated circuit comprising four NAND gates. It also comprises a mode-control signal having an on-state for one of said modes, and an off-state for the other of said modes, and an output circuit for transmitting the selected one of said modes. It also comprises first circuit means for connecting said first and second mode outputs to two of said NAND gate inputs, and second circuit means for connecting said mode-control signal to two other inputs of said NAND gate inputs, and also third means for connecting said output circuits to an output of one of said NAND gates.

BRIEF DESCRIPTION OF THE DRAWING

The foregoing and other objects and benefits of the invention will be more fully set forth below in connection with the best mode contemplated by the inventor of carrying out the invention, and in connection with which there are illustrations provided in the drawing, wherein:

The FIGURE of drawing is a schematic circuit diagram that illustrates the invention.

DESCRIPTION OF THE PREFERRED EMBODIMENT

In certain applications of practical equipment using timing pulse signals, there are situations where it is desirable to provide a continuous series of timing pulses that include two separate pulse rates. An illustration of such a system is provided in the copending patent application mentioned above and is particularly described therein as the portion illustrated by FIG. 8 in that application.

In such a system, it is desirable to be able to select a given mode for two different timing rates which are represented by separate series of pulse signals. Such arrangement permits switching as desired from one mode to another and back again. The system is such that it employs a simple circuit with a mere on/off signal to determine which mode is selected.

The particular circuit arrangement according to the invention that is described here, has specific application to a pipeline leak-detector instrument. Such instrument is inserted into a pipeline and moves along therein with the pipeline fluid while detecting acoustic signals that are created by any leak which may be encountered. Then when an acoustic leak signal appears, the timing signals are switched from one mode to another so that a recording device may be shifted from low speed to high speed during the leak-signal appearance. Thereafter, when the leak has been passed by the leak-detector instrument and the acoustic signal therefrom no longer exceeds a predetermined amplitude, the timing mode selector will automatically shift the timing-signal rate back to the first mode and thus maintain a relatively slow rate of recording to save the amount of record necessary. It will be appreciated that there are other and different uses for this invention which will readily suggest themselves to anyone skilled in the art.

The FIGURE drawing shows details of the above-indicated mode selector that includes a connection (not shown) that comes from a signal-level detector (not shown). This supplies an on/off signal that is applied to a terminal 126. The presence or absence of the on/off signal at terminal 126 will control the state of the mode selector.

The circuit according to the invention includes an integrated circuit 127 and a series-connected group of additional integrated circuits 130, 131, 132, and 133. The arrangement is such as to provide two separate pulse-rate outputs from an oscillator 136 which is the basic timing unit.

The integrated circuit 127 may be a commercial unit, and it is connected so as to provide four dual input NAND gates. These are interconnected, as indicated by the circuits shown, between the various numbered terminals of the integrated circuit 127. The result is that the presence or absence of a signal at the terminal 126 determines which mode is selected.

The oscillator 136 produces a continuous series of timing pulses which are fed over a circuit connection 137 to the input of the first integrated circuit 130. The output from 130 goes to the input of the next integrated circuit 131 over a circuit connection 138, and a series of connections continues from there to the integrated circuits 132 and 133, as indicated. The output at the end of the series goes over a circuit connection 140 to an input (terminal 10) of one of the NAND gates of the integrated circuit 127.

There is another output connection 139 that goes from the output of the integrated circuit 131, which is second in the series. This connection 139 goes to another one of the NAND gates (terminal 1) of the integrated circuit 127.

The integrated circuits 130–133 are commercial units and they are connected to act as counting circuits so that the pulse rate of the clock oscillator is reduced in two stages to provide two different modes or pulse rates at the separate output connections 139 and 140. In the preferred system being described, the clock oscillator 136 runs at a frequency of 64 cycles per second, and the counter circuits 130 and 131 are connected to each divide by sixteen with the arrangement such that the output connection 139 will carry the faster recording speed pulses at intervals of two seconds apart. And the other two counters 132 and 133 are connected as decade counters to produce the slow recording speed pulses over the other output connection 140 at intervals of two-hundred seconds apart.

As indicated above, the integrated circuit 127 is made up of four NAND gates. They are arranged so that each has two input circuits that are connected to the numbered terminals in the following pairs: 1–2, 4–5, 9–10, and 12–13. The output circuits are connected to the remaining terminals in order and respectively as follows: 3, 6, 8, and 11. It will be noted that terminal 7 is a ground connection, and terminal 14 is connected to a voltage supply.

The NAND gates are connected so that a predetermined one of the two modes of pulse-frequency inputs will be transmitted on over a circuit connection 141 to the input of an amplifier 142. The output of the amplifier 142 goes to the base electrode of a transistor 145 which has its collector-emitter circuit connected to an output for receiving the selected mode of timing pulses, e.g., that indicated by the caption "TO PRINT SOLONOID".

It will be understood from the foregoing that in the particular example being described which is part of the aforementioned copending application, the print solonoid (not shown) of the recorder in the copending application is energized once every 200 seconds as the instrument (mentioned above) starts a run. Consequently, at the usual speed of travel through the pipeline, the vehicle will travel a substantial distance between printouts. However, whenever leak-frequency sonic energy is detected above the predetermined amplitude set by a signal-level detector (not shown), it will produce a signal that is transmitted to the terminal 126. The signal thus produced by the leak-generated sonic energy will shift the mode selector to cause the print solonoid to be actuated every two seconds. And, during this time, the vehicle will have traveled a comparatively short distance between print-outs.

The foregoing particular embodiment of the invention has been set forth in considerable detail in accordance with the applicable statutes. However, this is not to be taken as in any way limiting the invention but merely as being descriptive thereof.

I claim:

1. Timing mode selector comprising in combination
a clock pulse generator for supplying a continuous series of timing pulses,
a first pair of integrated-circuit counters,
said counters being connected in series to the output of said generator for providing a predetermined first mode pulse rate output,
a second pair of integrated-circuit counters,
said second counters being connected in series to said first mode output for providing a predetermined second mode pulse rate output,
a unitary integrated circuit for alternatively selecting said first or second mode output comprising four NAND gates, each of said NAND gates having two input circuits and an output,
means for connecting a mode-control signal to said unitary integrated circuit,
said mode-control signal having an on-state for one of said modes and an off-state for the other of said modes,
an output circuit from said unitary integrated circuit for transmitting the selected one of said modes,
first circuit means for connecting said first and second mode pulse rate outputs to the inputs of two of said NAND gates,
second circuit means for connecting said mode-control signal connecting means to two other inputs of said NAND gates, and
third circuit means for connecting said output circuit to one of said NAND gate outputs.

* * * * *